United States Patent
Kim

(10) Patent No.: US 10,426,065 B2
(45) Date of Patent: Sep. 24, 2019

(54) COOLING APPARATUS FOR POWER CONVERTER

(71) Applicant: LSIS CO., LTD., Gyeonggi-do (KR)

(72) Inventor: Sung-Dae Kim, Gyeonggi-do (KR)

(73) Assignee: LSIS CO., LTD., Anyang-si, Gyeonggi-Do (KR)

(*) Notice: Subject to any disclaimer, the term of this patent is extended or adjusted under 35 U.S.C. 154(b) by 98 days.

(21) Appl. No.: 15/357,304

(22) Filed: Nov. 21, 2016

(65) Prior Publication Data
US 2017/0241676 A1 Aug. 24, 2017

(30) Foreign Application Priority Data
Feb. 22, 2016 (KR) .................. 10-2016-0020592

(51) Int. Cl.
*H05K 7/20* (2006.01)
*F25B 9/04* (2006.01)

(52) U.S. Cl.
CPC .......... *H05K 7/20927* (2013.01); *F25B 9/04* (2013.01); *H05K 7/20909* (2013.01)

(58) Field of Classification Search
CPC .... H05K 7/20927; H05K 7/20909; F25B 9/04
See application file for complete search history.

(56) References Cited

U.S. PATENT DOCUMENTS

| | | | |
|---|---|---|---|
| 3,654,768 A | 4/1972 | Inglis et al. | |
| 6,108,206 A | 8/2000 | Criniti et al. | |
| 7,751,188 B1 | 7/2010 | French et al. | |
| 2009/0235672 A1 | 9/2009 | Broerman | |
| 2010/0226090 A1 | 9/2010 | Gilliland et al. | |

(Continued)

FOREIGN PATENT DOCUMENTS

| | | | |
|---|---|---|---|
| CN | 102795076 A | * | 11/2012 |
| JP | H08316673 A | * | 11/1996 |
| JP | 2007285685 A | | 11/2007 |

(Continued)

OTHER PUBLICATIONS

Takemae et al., Cooling Structure, Nov. 29, 1996, JPH08316673A, Whole Document.*

(Continued)

*Primary Examiner* — Larry L Furdge
(74) *Attorney, Agent, or Firm* — K&L Gates LLP

(57) ABSTRACT

The cooling apparatus includes: a compressor configured to generate compressed air; first and second vortex tubes configured to generate cold air based on the compressed air generated from the compressor; a first valve installed between the compressor and the first vortex tube; a second valve installed between the compressor and the second vortex tube; first and second temperature sensors installed in the power converter and configured to measure the internal temperature of the power converter; and a control unit configured to determine whether or not the first and second vortex tubes supply the cold air into the power converter, based on first and second temperatures respectively measured by the first and second temperature sensors, and to transmit a valve open signal or a valve close signal to the first and second valves based on a result of the determination.

5 Claims, 3 Drawing Sheets

(56) References Cited

U.S. PATENT DOCUMENTS

2013/0153186 A1* 6/2013 Gotou ............... H01L 23/473
165/168

FOREIGN PATENT DOCUMENTS

| JP | 3160814 U | | 6/2010 |
|---|---|---|---|
| JP | 2014117121 A | | 6/2014 |
| KR | 20040046613 A | | 6/2004 |
| KR | 100726461 B1 | | 6/2007 |
| KR | 20120060411 A | * | 6/2012 |
| KR | 20130079763 A | | 7/2013 |
| WO | 2007148850 A1 | | 12/2007 |

OTHER PUBLICATIONS

Kweon et al., Anti-Freezing Apparatus for Door of Railway Vehicle, Jun. 12, 2012, KR20120060411A, Whole Document.*
Chenggang et al., Cooling Device of Vehicle-Mounted Energy Storage System, Nov. 28, 2012, CN102795076A, Whole Document.*
Search Report dated May 29, 2017 issued in corresponding European Application No. 16198592.4.
Japanese Office Action dated Sep. 5, 2017 corresponding to application No. 2016-226565.

* cited by examiner (a)　　　　　　　　　(b)

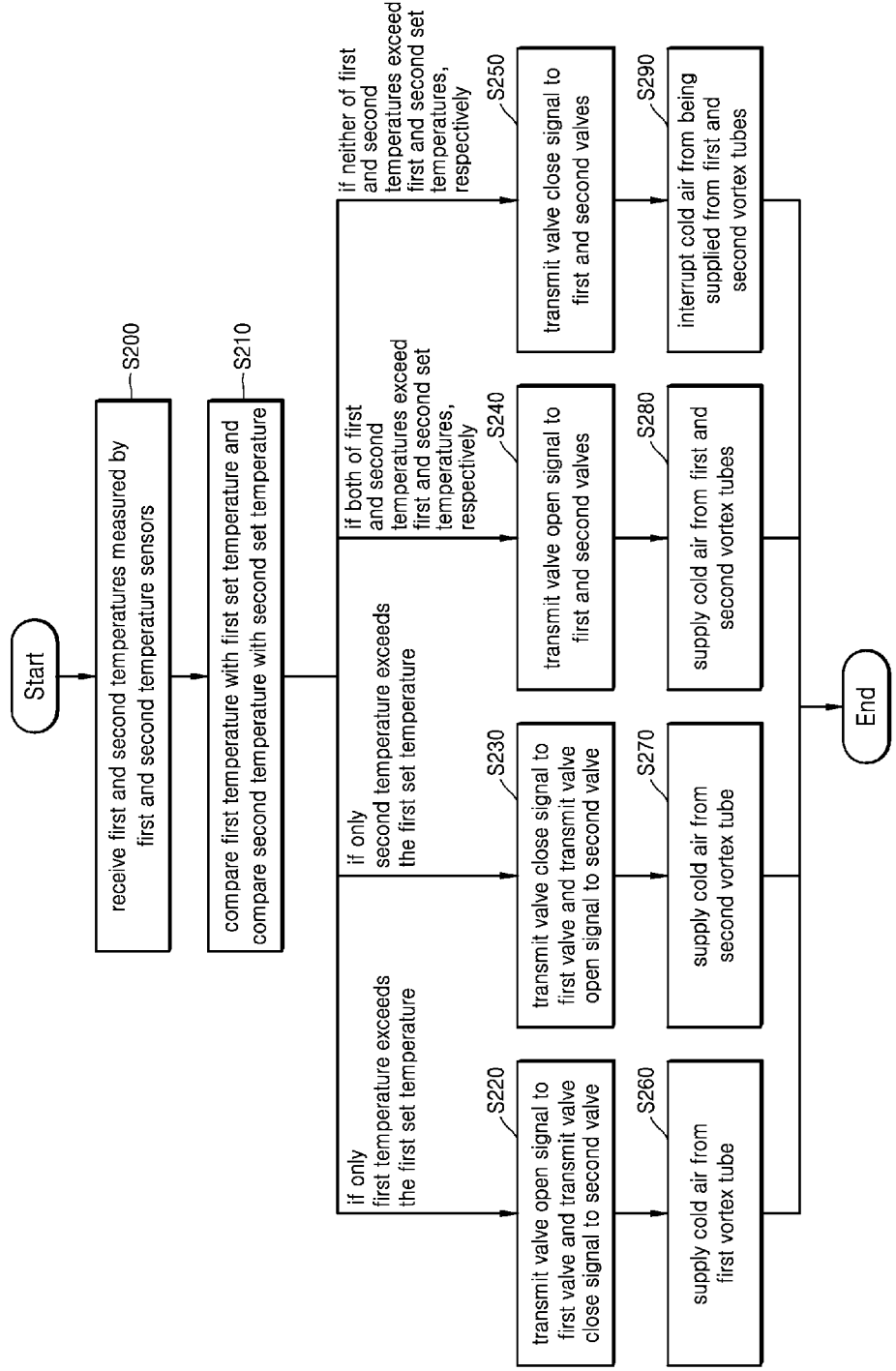

COOLING APPARATUS FOR POWER CONVERTER

CROSS REFERENCE TO RELATED APPLICATION

This application claims the benefit of Korean Patent Application No. 10-2016-0020592, filed on Feb. 22, 2016, entitled "COOLING APPARATUS FOR POWER CONVERTER", which is hereby incorporated by reference in its entirety into this application.

BACKGROUND

1. Technical Field

The present disclosure relates to a cooling apparatus and more particularly, to a cooling apparatus for a power converter, which includes a vortex tube to allow the cooling apparatus to cool the power converter stably.

2. Description of the Related Art

As a power converter, an apparatus such as an inverter for motor drive, a solar inverter, an electrical energy storage (EES) or the like, which is used in the industrial field, generates heat when it is driven.

Since the heat generated when the power converter is driven causes performance deterioration, reduced life, operation stop and the like of the apparatus, there is a consistent need for development of a system for cooling the apparatus with high efficiency.

Accordingly, a variety of cooling apparatuses for cooling the power converter has been proposed. A cooling apparatus may be classified into an air blowing type and a water cooling type.

The air blowing type is a method of using a fan to forcedly dissipate heat generated from a power converter, which is also referred to as a forced air cooling technique. The air blowing type is a technique for driving the fan to circulate air between cooling fins so as to maintain the power converter at a proper temperature.

However, the existing air blowing type cooling apparatus has a restriction in installation environments since there is a possibility that cooling efficiency is decreased depending on circumstances and arc is generated due to dusts.

In addition, the existing air blowing type cooling apparatus has to replace the fan periodically depending on drive time and environments of the fan. However, this incurs maintenance costs for stoppage and replacement of an inverter connection product group when the fan is replaced.

In addition, the existing air blowing type cooling apparatus has a limitation in application to a variety of industries requiring explosion-proof capability since it is exposed in the air.

Further, since the existing air blowing type cooling apparatus requires a number of cooling fins for appropriate cooling, there is a difficulty in compactness and light-weighting of the power converter due to a restriction on weight and volume of the cooling fins.

SUMMARY

It is an aspect of the present disclosure to provide a cooling apparatus for a power converter, which includes a vortex tube to allow the cooling apparatus to cool the power converter stably.

In accordance with one aspect of the present disclosure, there is provided a cooling apparatus for a power converter, including: a compressor configured to generate compressed air; first and second vortex tubes configured to generate cold air based on the compressed air generated from the compressor; a first valve installed between the compressor and the first vortex tube; a second valve installed between the compressor and the second vortex tube; first and second temperature sensors installed in the power converter and configured to measure the internal temperature of the power converter; and a control unit configured to determine whether or not the first and second vortex tubes supply the cold air into the power converter, based on first and second temperatures respectively measured by the first and second temperature sensors, and to transmit a valve open signal or a valve close signal to the first and second valves based on a result of the determination.

In accordance with another aspect of the present disclosure, there is provided a cooling apparatus for a power converter, including: a plurality of compressors configured to generate compressed air; a plurality of vortex tubes configured to generate cold air based on the compressed air generated from the plurality of compressors; a plurality of valves installed between the compressors and the vortex tubes; first and second temperature sensors installed in the power converter and configured to measure the internal temperature of the power converter; and a control unit configured to determine whether or not the vortex tubes supply the cold air into the power converter, based on first and second temperatures respectively measured by the first and second temperature sensors, and to transmit a valve open signal or a valve close signal to the valves based on a result of the determination, wherein the plurality of compressors, vortex tubes and valves are formed in a one-to-one correspondence.

The plurality of valves may include: first valves installed between the first vortex tubes and the corresponding compressors; and second valves installed between the second vortex tubes and the corresponding compressors.

The control unit may compare the first temperature with preset first set temperature, transmit the valve open signal to the first valves when the first temperature exceeds the first set temperature, and transmit the valve close signal to the first valves when the first temperature does not exceed the first set temperature.

The control unit may compare the second temperature with preset second set temperature, transmit the valve open signal to the second valves when the second temperature exceeds the second set temperature, and transmit the valve close signal to the second valves when the second temperature does not exceed the second set temperature.

The first temperature sensor may be installed in a case of the power converter and the second temperature sensor may be installed in a power conversion semiconductor device of the power converter.

The plurality of vortex tubes may include: first vortex tubes installed to supply the cold air to a case side of the power converter; and second vortex tubes installed to supply the cold air to a power conversion semiconductor device side of the power converter.

Advantages of the Invention

According to the invention, it is possible to provide a fan-less design, thereby reducing costs for fan replacement, and provide a vortex tube with semi-permanent durability, thereby reducing costs for maintenance.

In addition, when the cooling system of the present disclosure is applied, since the case of the power converter can be fabricated in a sealed form, it is possible to secure dust-proof capability and explosion-proof capability, thereby allowing application to a variety of environments.

In addition, since the temperature of the cold air is low, it is possible to reduce the volume and number of cooling fins, thereby reducing the volume and weight of the power converter.

Further, since the case of the power converter can be fabricated in a sealed fan-less form, it is possible to improve noise-proof capability, thereby allowing a design of a low-noise power converter.

BRIEF DESCRIPTION OF DRAWINGS

FIG. 4 is a flow chart illustrating an operation sequence of the power converter cooling apparatus according to the embodiment of the present disclosure.

DETAILED DESCRIPTION

Figure 1:
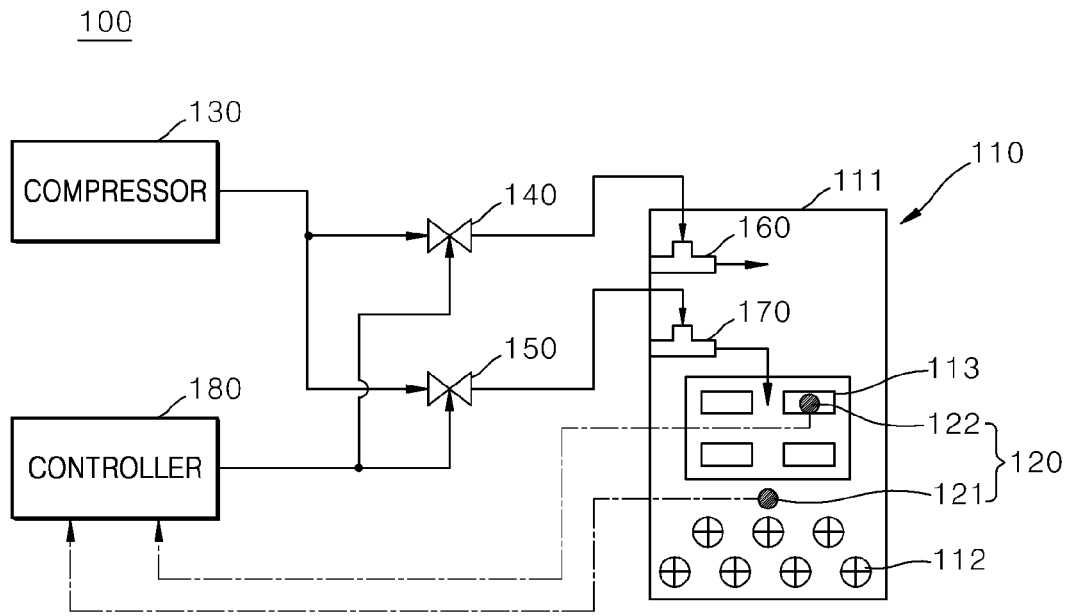
FIG. 1 is a view illustrating the configuration of a cooling apparatus for a power converter according to an embodiment of the present disclosure.

The above objects, features and advantages will become more clearly apparent from the following detailed description in conjunction with the accompanying drawings. However, the present disclosure is not limited to the following embodiments but may be implemented in different ways. Therefore, the technical ideas of the present disclosure can be easily understood and practiced by those skilled in the art. The spirit and scope of the present disclosure are defined by the claims. Throughout the drawings, the same or similar elements are denoted by the same reference numerals.

In the following detailed description of the present disclosure, concrete description on related functions or constructions will be omitted if it is deemed that the functions and/or constructions may unnecessarily obscure the gist of the present disclosure.

The terms used herein are defined in view of functions in the embodiments and may be varied depending on intention of a user or operator or practices. Therefore, the definition of the terms should be made based on the contents over the specification.

Hereinafter, the configuration and function of a cooling apparatus for a power converter according to an embodiment of the present disclosure will be described in detail with reference to the accompanying drawings.

FIG. 1 is a view illustrating the configuration of a cooling apparatus for a power converter according to an embodiment of the present disclosure.

Referring to FIG. 1, a cooling apparatus 100 for a power converter (hereinafter referred to as a 'cooling system') according to an embodiment of the present disclosure includes, but is not limited to, a power converter 110, a temperature sensor 120, a compressor 130, a first valve 140, a second valve 150, a first vortex tube 160, a second vortex tube 170 and a control unit 180.

The power converter 110 is an apparatus for converting a form of power (e.g., a current, voltage, frequency and so on of power) depending on where it is used and. For example, the power converter 110 may be an inverter for motor driving, a solar inverter, an energy storage system (ESS), a converter or the like.

The power converter 110 includes a plurality of cooling fins installed in a sealed case 111, and a semiconductor device 113 for power conversion.

That is, although a conventional power converter is of an opened type since it has a structure including a fan, the power converter 110 of the present disclosure is of a sealed type.

For example, the cooling fins 112 may be located at the lowermost point in the power converter 110 and the power conversion semiconductor device 113 may be located above the cooling fins 112, without being limited thereto.

In addition, a number of power conversion semiconductor devices 113 may be located in the power converter 110. The number of power conversion semiconductor devices 113 included in the power converter 110 may be set differently.

The temperature sensor 120 is installed in the power converter 110 and measures the internal temperature of the power converter 110 which is then provided to the control unit 180.

The temperature sensor 120 may include a first temperature sensor 121 for measuring the internal temperature of the power converter 110 and a second temperature sensor 122 for measuring the temperature of the power conversion semiconductor device 113. The first temperature sensor 121 may be installed adjacent to the case 111 and the second temperature sensor 122 may be installed adjacent to the power conversion semiconductor device 113.

That is, the first temperature sensor 121 may be installed in the case 111 of the power converter 110 and can measure the temperature of the case 111. The second temperature sensor 122 may be installed in the power conversion semiconductor device 113 and can measure the temperature of the power conversion semiconductor device 113.

The compressor 130 is provided to supply compressed air to the first and second vortex tubes 160 and 170. The temperature of cold air and hot air generated from the vortex tubes may be varied depending on the temperature and pressure of the compressed air.

Accordingly, the temperature and pressure of the compressed air supplied by the compressor 130 may be appropriately selected depending on the use and installation environments of the cooling system 100.

For example, the compressor 130 may be constituted by, but is not limited to, a pump for generating compressed air and a pressure tank for storing the compressed air generated by the pump.

The first valve 140 is installed between the compressor 130 and the first vortex tube 160 and controls a flow of the compressed air by being opened or closed according to control of the control unit 180.

Specifically, the first valve 140 is opened according to the control of the control unit 180 such that the compressed air provided from the compressor 130 is supplied to the first vortex tube 160. In addition, the first valve 140 is closed according to the control of the control unit 180 such that the compressed air provided from the compressor 130 is interrupted from being supplied to the first vortex tube 160.

The compressor 130 and the first vortex tube 160 may be connected by a pipe on which the first valve 140 may be installed.

The second valve 150 is installed between the compressor 130 and the second vortex tube 170 and controls a flow of the compressed air by being opened or closed according to control of the control unit 180.

Specifically, the second valve 150 is opened according to the control of the control unit 180 such that the compressed air provided from the compressor 130 is supplied to the second vortex tube 170. In addition, the second valve 150 is closed according to the control of the control unit 180 such that the compressed air provided from the compressor 130 is interrupted from being supplied to the second vortex tube 170.

The compressor 130 and the second vortex tube 170 may be connected by a pipe on which the second valve 150 may be installed.

The first and second vortex tubes 160 and 170, which are called 'Ranque-Hilsch vortex tube,' separate the compressed air supplied from the compressor 130 to generate cold air and hot air.

The matters on the shape and design of the first and second vortex tubes 160 and 170 may be appropriately selected by those skilled in the art depending on the use purpose and installation environments. The first and second vortex tubes 160 and 170 may be selected from a variety of vortex tubes known in the art.

The cold air generated from the first and second vortex tubes 160 and 170 is supplied into the power converter 110 and plays a role of lowering the temperature of the power converter 110.

In particular, the first vortex tube 160 may be disposed at a position suitable to lower the temperature of the case 111 of the power converter 110. In addition, the second vortex tube 170 may be disposed at a position suitable to lower the temperature of the power conversion semiconductor device 113 of the power converter 110.

For example, the first vortex tube 160 may be installed such that the cold air generated from the first vortex tube 160 directs to the case 111. The second vortex tube 170 may be disposed adjacent to the power conversion semiconductor device 113.

The control unit 180 receives a temperature measured by the temperature sensor 120 and determines whether or not the first and second vortex tubes 160 and 170 have to supply the cold air to the power converter 110, based on the received temperature.

The control unit 180 compares a first temperature measured by the first temperature sensor 121 with a preset first set temperature. As a result of the comparison, if the first temperature exceeds the first set temperature, the control unit 180 determines that the first vortex tube 160 has to supply the cold air to the power converter 110.

In addition, the control unit 180 compares a second temperature measured by the second temperature sensor 122 with a preset second set temperature. As a result of the comparison, if the second temperature exceeds the second set temperature, the control unit 180 determines that the second vortex tube 170 has to supply the cold air to the power converter 110.

The first and second set temperatures may be set by a user in consideration of an applied system and installation environments. For example, the first set temperature may be set to fall within a range of 80° C. to 100° C. and the second set temperature may be set to fall within a range of 100° C. to 120° C.

A flow rate of the cold air supplied by the vortex tubes 160 and 170 may be regulated by a valve. When it is determined that the temperature sensed by the temperature sensor 120 is higher than a preset temperature range and accordingly the valves 140 and 150 are controlled to be opened, the control unit 180 can control a degree of opening of the valves 140 and 150 to regulate the flow rate. At this time, a flow rate of introduced air may be preset depending on an extent by which the temperature sensed by the temperature sensor 120 exceeds the preset temperature. For example, a flow rate when the temperature sensed by the temperature sensor 120 exceeds the preset temperature by 1° C. to 10° C. and a flow rate when the temperature sensed by the temperature sensor 120 exceeds the preset temperature by 11° C. to 20° C. may be preset. Depending on an extent by which the temperature sensed by the temperature sensor 120 exceeds the preset temperature, the control unit 180 controls the valves 140 and 150 so that a set flow rate of the cold air can be introduced.

In the meantime, when the control unit 180 determines that the first vortex tube 160 has to supply the cold air to the power converter 110, the control unit 180 transmits a valve open signal to the first valve 140.

In addition, when the control unit 180 determines that the second vortex tube 170 has to supply the cold air to the power converter 110, the control unit 180 transmits a valve open signal to the second valve 150.

Accordingly, the first and second valves 140 and 150 are opened in response to receiving the valve open signal of the control unit 180. Accordingly, the compressed air provided from the compressor 130 can be supplied to the first and second vortex tubes 160 and 170 via the first and second valves 140 and 150.

On the other hand, if the temperature measured by the first temperature sensor 121 does not exceed the first set temperature (i.e., is equal to or lower than the first set temperature), the control unit 180 determines that the first vortex tube 160 need not supply the cold air to the power converter 110.

In addition, if the temperature measured by the second temperature sensor 122 does not exceed the second set temperature (i.e., is equal to or lower than the second set temperature), the control unit 180 determines that the second vortex tube 170 need not supply the cold air to the power converter 110.

When the control unit 180 determines that the first vortex tube 160 need not supply the cold air to the power converter 110, the control unit 180 transmits a valve close signal to the first valve 140.

In addition, when the control unit 180 determines that the second vortex tube 170 need not supply the cold air to the power converter 110, the control unit 180 transmits a valve close signal to the second valve 150.

The first and second valves 140 and 150 are closed in response to receiving the valve close signal of the control unit 180. Accordingly, the compressed air provided from the compressor 130 can be interrupted by the first and second valves 140 and 150 to prevent the compressed air from being supplied to the first and second vortex tubes 160 and 170.

Figure 2:
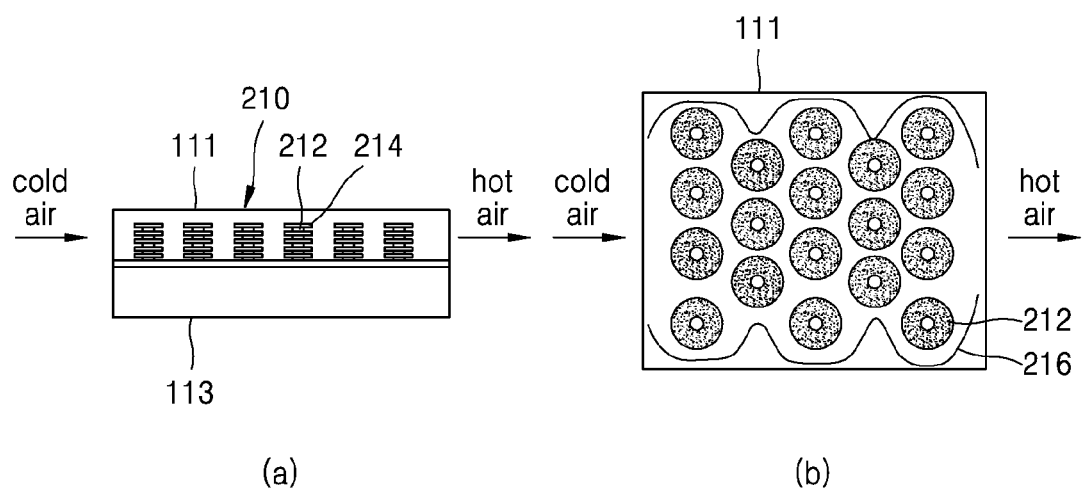
FIG. 2 illustrates one example of a heat exchanger applied to the power converter cooling apparatus according to the embodiment of the present disclosure.
Figure 3:
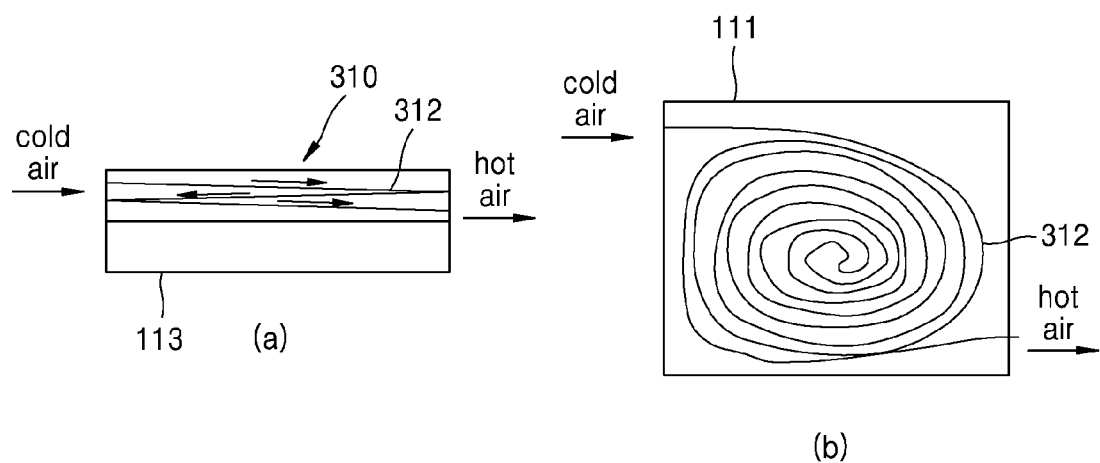
FIG. 3 illustrates another example of the heat exchanger applied to the power converter cooling apparatus according to the embodiment of the present disclosure.

FIGS. 2 and 3 illustrate the power conversion semiconductor device 113 of FIG. 1 in detail, FIG. 2 showing a fin type heat exchanger and FIG. 3 showing a pipe type heat exchanger. FIG. 2 illustrates an embodiment of the fin type heat exchanger, FIG. 2A being a side view and FIG. 2B being a plan view. Referring to FIG. 2, a heat exchanger 210 is formed on the power conversion semiconductor device 113 and is sealed by the case 111 of the power converter.

When the heat exchanger 210 is a fin type heat exchanger, the heat exchanger 210 may be configured to include a sealed case 111 and pillars 212 and discs 214 which are alternately stacked in the sealed case 111. However, the structure of the heat exchanger 210 is not limited thereto.

Specifically, the heat exchanger 210 has a stacked structure where a pillar 212 is formed on the bottom of the sealed case 111, a disc 214 is formed thereon, another pillar 212 is formed on the disc 214, etc.

At this time, the sealed case 111 may be made of a material having poor heat transferability and good adiabaticity.

In one embodiment, a plurality of pillars 212 may be formed in a cylindrical shape to provide a smooth flow of air. The pillars 212 may be arranged perpendicular to the air flow so that heat can be efficiently transferred from the power conversion semiconductor device 113.

In addition, a flow guide 216 may be installed in or near the inner side of the sealed case 111 so that air introduced into the sealed case 111 can be smoothly moved.

In one embodiment, the flow guide 216 is formed between the outermost pillar 212 and the sealed case 111 in the same direction in which the air introduced into the sealed case 111 is moved.

FIG. 3 illustrates an embodiment of the pipe type heat exchanger, FIG. 3A being a side view and FIG. 3B being a plan view.

Referring to FIG. 3, when a heat exchanger 310 is a pipe type heat exchanger, the heat exchanger 310 makes heat exchange in a way of extending a flow length of air. Such a heat exchanger 310 has high heat exchangeability but may have an effect on the effect of the vortex tubes since flow resistance increases with increase in the length of a flow pipe 312 or with decrease in the diameter of the flow pipe 312. Accordingly, it is necessary for a user to properly regulate the length and diameter of the flow pipe 312 installed in the heat exchanger 310.

Depending on the shape of the flow pipe 312, the heat exchanger 310 may be an S-shaped heat exchanger or a spiral heat exchanger. In this embodiment, the heat exchanger 310 is shown as the spiral heat exchanger.

If the heat exchanger 310 is of a cochlear canal shape instead of the S-shape, a temperature distribution of the heat exchanger 310 may be unformed. However, since this may result in poor efficiency due to increased flow resistance, it is preferable that the length and diameter of the flow pipe 312 is determined depending on the performance of the vortex tubes.

Although the above embodiment has been described with a case where two vortex tubes are formed, the number of vortex tubes may be two or more. When the number of vortex tubes is two or more, the vortex tubes may be classified into a first group of vortex tubes installed to supply cold air to the case side and a second group of second vortex tubes installed in the power conversion semiconductor device.

In addition, although it has been described in the above embodiment that a plurality of vortex tubes is formed in the single compressor, the number of compressors may be equal to the number of vortex tubes. In this case, the compressors and the vortex tubes may be connected in a one-to-one correspondence via pipes on which the same number of valves is formed.

More specifically, when a number of compressors, vortex tubes and valves are formed in correspondence, the valves may include first valves and second valves. The first valves may be installed between the first vortex tubes and the corresponding compressors. The second valves may be installed between the second vortex tubes and the corresponding compressors.

In this case, the control unit may transmit a valve open signal and/or a valve close signal to the first valves and/or the second valves.

The configuration of the cooling apparatus for the power converter has been described in the above. Hereinafter, the operation of the cooling apparatus for the power converter will be described in detail with reference to the accompanying drawings.

FIG. 4 is a flow chart illustrating an operation sequence of the power converter cooling apparatus according to the embodiment of the present disclosure.

Referring to FIG. 4, the control unit 180 receives the first temperature measured by the first temperature sensor 121 and the second temperature measured by the second temperature sensor 122 (S200). The control unit 180 compares the received first temperature with the first set temperature to determine whether or not the first temperature exceeds the first set temperature and compares the received second temperature with the second set temperature to determine whether or not the second temperature exceeds the second set temperature (S210).

If it is determined at Step S210 that the first temperature exceeds the first set temperature and the second temperature does not exceed the second set temperature (i.e., is equal to or lower than the second set temperature), the control unit 180 transmits the valve open signal to the first valve 140 and transmits the valve close signal to the second valve 150 (S220).

Accordingly, the first valve 140 is opened to supply the compressed air to the first vortex tube 160 and the first vortex tube 160 supplies the cold air to the power converter 110 (S260). In particular, the cold air supplied at Step S260 is supplied to the case 111 of the power converter 110.

If it is determined at Step S210 that the first temperature does not exceed the first set temperature (i.e., is equal to or lower than the first set temperature) and the second temperature exceeds the second set temperature, the control unit 180 transmits the valve close signal to the first valve 140 and transmits the valve open signal to the second valve 150 (S230).

Accordingly, the second valve 150 is opened to supply the compressed air to the second vortex tube 170 and the second vortex tube 170 supplies the cold air to the power converter 110 (S270). In particular, the cold air supplied at Step S270 is supplied to the power conversion semiconductor device 113 of the power converter 110.

If it is determined at Step S210 that the first temperature exceeds the first set temperature and the second temperature exceeds the second set temperature, the control unit 180 transmits the valve open signal to the first and second valves 140 and 150 (S240).

Accordingly, the first and second valves 140 and 150 are opened to supply the compressed air to the first and second vortex tubes 160 and 170 and the first and second vortex tubes 160 and 170 supply the cold air to the power converter 110 (S280). In particular, the cold air supplied at Step S280 is supplied to the case 111 and the power conversion semiconductor device 113 of the power converter 110.

If it is determined at Step S210 that the first temperature does not exceed the first set temperature (i.e., is equal to or lower than the first set temperature) and the second temperature does not exceed the second set temperature (i.e., is equal to or lower than the second set temperature), the control unit 180 transmits the valve close signal to the first and second valves 140 and 150 (S250).

Accordingly, the first and second valves 140 and 150 are closed to interrupt the compressed air from being supplied to the first and second vortex tubes 160 and 170 and the cold air is interrupted from being supplied from the first and second vortex tubes 160 and 170 to the power converter 110 (S290).

According to the present disclosure, it is possible to provide a fan-less design, thereby reducing costs for fan replacement, and provide a vortex tube with semi-permanent durability, thereby reducing costs for maintenance.

In addition, when the cooling system of the present disclosure is applied, since the case of the power converter can be fabricated in a sealed form, it is possible to secure dust-proof capability and explosion-proof capability, thereby allowing application to a variety of environments.

In addition, since the temperature of the cold air is low, it is possible to reduce the volume and number of cooling fins, thereby reducing the volume and weight of the power converter.

Further, since the case of the power converter can be fabricated in a sealed fan-less form, it is possible to improve noise-proof capability, thereby allowing a design of a low-noise power converter.

While the present disclosure has been particularly shown and described with reference to exemplary embodiments thereof, it will be understood by those skilled in the art that various changes in form and details may be made therein without departing from the spirit and scope of the present disclosure. The exemplary embodiments are provided for the purpose of illustrating the invention, not in a limitative sense. Thus, it is intended that the present disclosure covers the modifications and variations of this invention provided they come within the scope of the appended claims and their equivalents.

What is claimed is:

1. A cooling apparatus for a power converter for cooling heat generated when the power converter is driven, comprising:
    a plurality of cooling fins installed in a sealed case, and a semiconductor device for power conversion;
    a compressor configured to generate compressed air;
    first and second vortex tubes configured to generate cold air based on the compressed air generated from the compressor;
    a first valve installed between the compressor and the first vortex tube;
    a second valve installed between the compressor and the second vortex tube;
    first and second temperature sensors installed in the power converter and configured to measure the internal temperature of the power converter; and
    a control unit configured to determine whether or not the first and second vortex tubes supply the cold air into the power converter, based on first and second temperatures respectively measured by the first and second temperature sensors, and to transmit a valve open signal or a valve close signal to the first and second valves based on a result of the determination,
    wherein the control unit is connected to the first and second temperature sensors and to the first and second valves,
    wherein a heat exchanger is formed on the semiconductor device and is sealed by the sealed case of the power converter,
    wherein the heat exchanger comprises a first pillar formed on the bottom of the sealed case, a disc formed on the first pillar, and a second pillar formed on the disc,
    wherein the pillars are formed in a cylindrical shape to provide an air flow that is smooth and are arranged perpendicular to the air flow so that heat can be efficiently transferred from the semiconductor device,
    wherein a flow guide is installed in or near an inner side of the sealed case so that air introduced into the sealed case can be smoothly moved to create the air flow, and
    wherein the flow guide is formed between an outermost pillar and the sealed case in the same direction as the air flow.

2. The cooling apparatus according to claim 1,
    wherein the control unit compares the first temperature with a preset first set temperature,
    the control unit transmits the valve open signal to the first valve when the first temperature exceeds the preset first set temperature, and
    the control unit transmits the valve close signal to the first valve when the first temperature does not exceed the preset first set temperature.

3. The cooling apparatus according to claim 1,
    wherein the control unit compares the second temperature with a preset second set temperature,
    the control unit transmits the valve open signal to the second valve when the second temperature exceeds the preset second set temperature, and
    the control unit transmits the valve close signal to the second valve when the second temperature does not exceed the preset second set temperature.

4. The cooling apparatus according to claim 1,
    wherein the first temperature sensor is installed in the sealed case of the power converter and
    the second temperature sensor is installed in the semiconductor device of the power converter.

5. The cooling apparatus according to claim 1,
    wherein the first vortex tube is installed to supply the cold air to the sealed case side of the power converter and the second vortex tube is installed to supply the cold air to the semiconductor device side of the power converter.

* * * * *